(12) United States Patent
Abdalla et al.

(10) Patent No.: US 10,200,009 B2
(45) Date of Patent: Feb. 5, 2019

(54) SWITCHABLE TRANSFORMER-BASED BALUN

(71) Applicant: Analog Devices Global, Hamilton (BM)

(72) Inventors: Mohamed A. Abdalla, Cairo (EG); Mohamed Mobarak, Giza (EG); Ahmed Ibrahim Khalil, Cairo (EG)

(73) Assignee: Analog Devices Global, Hamilton (BM)

( * ) Notice: Subject to any disclaimer, the term of this patent is extended or adjusted under 35 U.S.C. 154(b) by 57 days.

(21) Appl. No.: 15/253,647

(22) Filed: Aug. 31, 2016

(65) Prior Publication Data

US 2018/0062607 A1    Mar. 1, 2018

(51) Int. Cl.

| | |
|---|---|
| *H03H 7/42* | (2006.01) |
| *H03H 11/32* | (2006.01) |
| *H01F 27/40* | (2006.01) |
| *H01F 21/12* | (2006.01) |
| *H01F 27/28* | (2006.01) |
| *H01L 23/522* | (2006.01) |
| *H03H 7/01* | (2006.01) |
| *H03H 7/09* | (2006.01) |
| *H01P 5/10* | (2006.01) |
| *H01F 17/00* | (2006.01) |

(52) U.S. Cl.
CPC .............. *H03H 7/42* (2013.01); *H01F 21/12* (2013.01); *H01F 27/2804* (2013.01); *H01F 27/40* (2013.01); *H01L 23/5223* (2013.01); *H03H 7/0153* (2013.01); *H03H 7/09* (2013.01); *H03H 7/422* (2013.01); *H03H 11/32* (2013.01); *H01F 2017/0026* (2013.01); *H03H 2210/025* (2013.01)

(58) Field of Classification Search
CPC ................. H03H 7/42; H03H 11/32
USPC ............................................. 333/25
See application file for complete search history.

(56) References Cited

U.S. PATENT DOCUMENTS

| | | | |
|---|---|---|---|
| 7,068,140 B2 | 6/2006 | Chou | |
| 7,626,472 B2 * | 12/2009 | Davies-Venn | H03H 7/42 333/185 |

(Continued)

OTHER PUBLICATIONS

Boglione, Luciano, et al., "A tunable Marchand balun at K band in Silicon Germanium (SiGe) technology", GeMiC 2015, Mar. 16-18, 2015, Nürnberg, Germany, (2015), 292-295.

(Continued)

*Primary Examiner* — Dean Takaoka
(74) *Attorney, Agent, or Firm* — Schwegman Lundberg & Woessner, P.A.

(57) ABSTRACT

A transformer-based balun circuit is disclosed herein. The balun can be implemented using a spiral transformer, where primary and secondary transformer windings can be inductively coupled and can be implemented on the same metal layer (or different metal layers, e.g. vertically adjacent metal layers). The balun can further include a compensation capacitor and a digital frequency tuning circuit. The compensation capacitor can be introduced at one of the differential terminals to reduce or suppress the amplitude and phase imbalance. The digital frequency tuning circuit can be a switchable bank of capacitors, which allows for tuning the frequency of operation of the transformer-based balun.

25 Claims, 6 Drawing Sheets

(56) References Cited

U.S. PATENT DOCUMENTS

| | | | | |
|---|---|---|---|---|
| 8,299,869 B2* | 10/2012 | Laporte | .................. | H01F 21/12 |
| | | | | 333/25 |
| 8,339,203 B2* | 12/2012 | Visser | ..................... | H03F 1/565 |
| | | | | 330/301 |
| 8,368,481 B2* | 2/2013 | Jin | ......................... | H03H 7/42 |
| | | | | 333/101 |
| 8,436,695 B2* | 5/2013 | Mu | ......................... | H03H 7/42 |
| | | | | 333/238 |
| 8,552,812 B2* | 10/2013 | Yen | .................... | H01L 23/5223 |
| | | | | 333/25 |
| 8,564,382 B2* | 10/2013 | Liu | .................... | H01F 17/0013 |
| | | | | 333/204 |
| 8,975,979 B2* | 3/2015 | Yen | .................... | H01L 23/5223 |
| | | | | 333/25 |
| 9,293,797 B2* | 3/2016 | Kim | ..................... | H03K 17/693 |
| 9,571,060 B2* | 2/2017 | Gianesello | .......... | H01F 27/2804 |
| 9,755,610 B2* | 9/2017 | Gianesello | ............... | H03H 7/42 |
| 2007/0216509 A1 | 9/2007 | Yen et al. | | |
| 2008/0238568 A1 | 10/2008 | Davies-venn et al. | | |
| 2008/0278258 A1* | 11/2008 | Liu | ......................... | H03H 7/42 |
| | | | | 333/25 |
| 2009/0085689 A1 | 4/2009 | Rohani et al. | | |
| 2011/0128088 A1 | 6/2011 | Jin et al. | | |
| 2011/0204990 A1 | 8/2011 | Stockstad | | |
| 2012/0146741 A1 | 6/2012 | Yen et al. | | |
| 2012/0161896 A1 | 6/2012 | Lee et al. | | |
| 2013/0200959 A1 | 8/2013 | Chen et al. | | |
| 2014/0176388 A1* | 6/2014 | Van Liempd | ............ | H01Q 1/50 |
| | | | | 343/861 |
| 2015/0070242 A1* | 3/2015 | Kawai | ...................... | H03H 7/20 |
| | | | | 343/853 |
| 2015/0137869 A1* | 5/2015 | Akizuki | ............... | H03D 7/1441 |
| | | | | 327/359 |

OTHER PUBLICATIONS

Long, John R., "Monolithic Transformers for Silicon RF IC Design", IEEE Journal of Solid-State Circuits, 35(9), (Sep. 2000), 1368-1382.

Ma, Kaixue, et al., "Miniaturized 40-60 GHz On-Chip Balun With Capacitive Loading Compensation", IEEE Electron Device Letters, 35(4), (Apr. 2014), 434-436.

Miao, Xiaofeng, et al., "Design of Compact Frequency-Tuned Microstrip Balun", IEEE Antennas and Wireless Propagation Letters, vol. 9, (2010), 686-688.

Michaelsen, Rasmus, et al., "A Modified Marchand Balun Configuration With Tunable Phase Balance", IEEE Microwave and Wireless Components Letter, 23(2), (Feb. 2013), 66-68.

Zhou, L.-H., et al., "Tunable filtering balun with enhanced stopband rejection", Electronics Letters, 48(14), (2012), 2 pgs.

"International Application Serial No. PCT/IB2017/001170, International Search Report dated Feb. 7, 2018", 7 pgs.

"International Application Serial No. PCT/IB2017/001170, Invitation to Pay Add'l Fees and Partial Search Rpt dated Dec. 11, 2017", 7 pgs.

"International Application Serial No. PCT/IB2017/001170, Written Opinion dated Feb. 7, 2018", 15 pgs.

* cited by examiner

SWITCHABLE TRANSFORMER-BASED BALUN

BACKGROUND

Balanced-to-unbalanced circuits (or baluns) are electrical devices that are used to convert a balanced input signal to an unbalanced output signal, or an unbalanced input signal to a balanced output signal. With the capability to generate balanced signals, balun circuits are widely used in a variety of communication systems, such as antenna feed networks, differential amplifiers, balanced mixers, and frequency multipliers, to name a few examples.

SUMMARY OF THE DISCLOSURE

Embodiments of the present disclosure can provide an integrated balanced-signal-to-unbalanced-signal (balun) circuit. The balun circuit can be a transformer-based balun circuit. The balun circuit can include a first transformer winding having a first terminal and a second terminal operably coupled for a differential signal. The balun circuit can also include a second transformer winding having a third terminal and a fourth terminal operably coupled for a single-ended signal. The balun circuit can include an integrated capacitor having a first electrode conductively coupled to one of the first terminal or the second terminal of the first transformer winding. The first transformer winding and the second transformer winding can be inductively coupled to each other. Additionally, the first transformer winding and the second transformer winding can be at least partially coplanar (or one winding can be vertically adjacent to the other). For example, portions of the primary and secondary windings can be provided on a commonly-shared metal layer of an integrated circuit (or on neighboring layers that are adjacent to each other).

In an example, a tunable transformer-based balun circuit can include a secondary winding with two balanced terminals, a primary winding with an unbalanced terminal, and a digital frequency tuning circuit. The tuning circuit can be coupled between the balanced terminals, or between the unbalanced terminal and ground. In an example when the tuning circuit is coupled between the balanced terminals, the tuning circuit can include at least one capacitor between the two balanced terminals, and a digitally-controlled switch coupled to the at least one capacitor. The digitally-controlled switch can be configured to activate or deactivate the at least one capacitor based on an input logic signal to control an operating frequency range of the balun circuit.

In an example, a method for adjusting the operating frequency of a balun with two balanced terminals and an unbalanced terminal can include providing a capacitor ladder with a plurality of capacitors. The capacitor ladder can be coupled to the two balanced terminals. Each capacitor of the plurality of capacitors is coupled to a digital switch of a corresponding plurality of digital switches. The method can further include receiving for each of the plurality of switches, a first logic signal and second logic signal corresponding to a desired operating frequency of the balun. The first logic signal can be applied to a gate terminal of the digital switch, and the second logic signal can be applied to a drain terminal and a source terminal of the digital switch, to activate or de-activate the digital switch in order to adjust the operating frequency of the balun to the desired operating frequency.

This overview is intended to provide an overview of subject matter of the present patent application. It is not intended to provide an exclusive or exhaustive explanation of the invention. The detailed description is included to provide further information about the present patent application.

Figure 1:
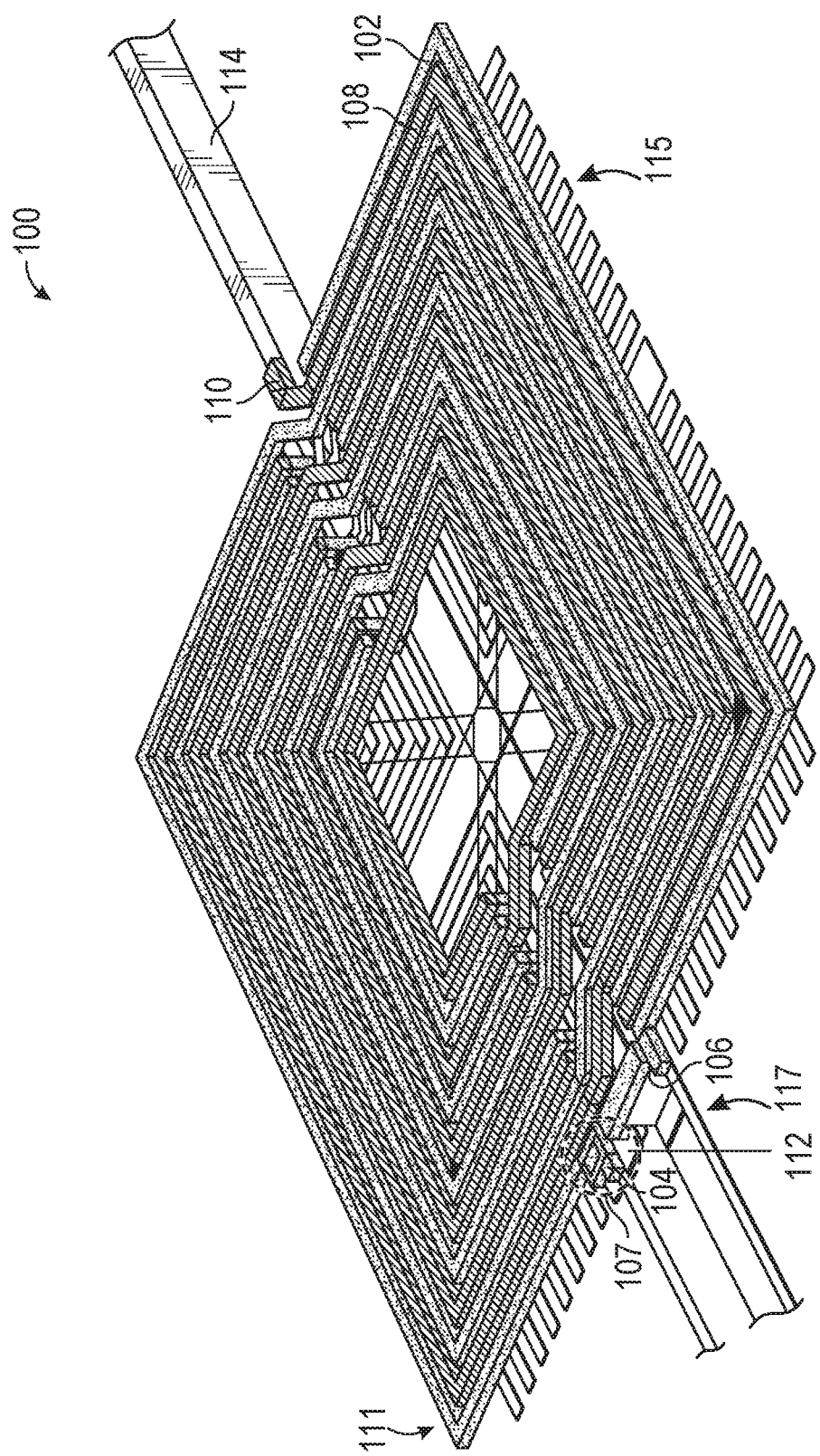
FIG. 1 depicts a transformer-based balun circuit with an integrated mismatch compensation capacitor, in accordance with an example embodiment.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In accordance with proposed techniques, a balun circuit can be implemented using a spiral transformer, thereby avoiding the larger footprint of a Marchand Balun. Additionally, phase and amplitude imbalance of the transformer-based balun circuit are further reduced or suppressed by using a compensation capacitor and a digital frequency tuning circuit. More specifically, the compensation capacitor can be introduced at one of the differential terminals to reduce or suppress the amplitude and phase imbalance, which can be important for single-ended to differential conversion (and vice versa) in mixer applications to achieve low port-to-port isolation. The digital frequency tuning circuit can be a switchable bank of capacitors, which allows tuning the frequency of operation of the transformer-based balun. An additional fixed capacitor (e.g., between the differential terminals) can be provided to center the balun operating frequency to a desired frequency range. The tunability achieved via the switchable capacitor bank and the fixed capacitor can be beneficial for one or more of multi-band communication applications or filtering for undesired out-of-band signals (which is a benefit that is not available when using a wide-band Marchand balun).

In an example, field effect transistor (FET) switches (e.g., metal-oxide-semiconductor FET, or MOSFET) can be used in the digital frequency tuning circuit. To ensure the linearity of the transformer-based balun is not affected by added MOSFET switch non-linearity, the drain/source terminals of the switches can be adaptively biased according to the switch state, resulting in very low non-linear contribution. In this regard, the balun circuits disclosed herein can also be used in applications (e.g., single-ended output power amplifiers), where a very linear balun is optimal at the amplifier output.

A Marchand balun is a microwave balun circuits used to convert unbalanced to balanced signals. A Marchand balun includes four coupled lines which form two grounded terminals, one unbalanced terminal, and two balanced terminals. Even though Marchand baluns provide good amplitude and phase imbalance, their use in integrated circuits may be prohibitive due to their large area. Transformer-based baluns, on the other hand, can occupy a smaller area. However, transformer-based baluns can be characterized by poor phase and amplitude imbalance, and can be inherently more narrow-band in comparison to Marchand baluns. Additional considerations in balun circuit design include tunability of the operating frequency, which can be challenging to achieve without affecting the balun circuit linearity.

FIG. 1 depicts a transformer-based balun circuit with an integrated mismatch compensation capacitor, in accordance with an example embodiment. Referring to FIG. 1, the transformer-based balun circuit 100 can be formed to include a primary winding 108 and a secondary winding 102, which can be inductively coupled to each other. The primary winding 108 can include a single-ended (unbalanced) terminal 110, with the other end of the primary winding 108 being coupled to the single-ended ground terminal 114 (a corresponding differential ground terminal is referenced at 117). Even though the single-ended ground terminal 114 is illustrated as being separate from the differential ground terminal 117, the disclosure may not be so limited and a common ground terminal may also be used. The secondary winding 102 can include differential terminals 104 and 106, which can form the differential output of the balun circuit 100.

In an example, the primary transformer winding 108 and the secondary transformer winding 102 can be formed on the same metal layer 111, so that both windings are at least partially coplanar. In another example, the windings 108 and 102 can be formed using two metal layers that are vertically adjacent (i.e., one layer is on top of the other, and an insulation layer in between).

In an example, the balun 100 can include a mismatch compensation capacitor 107, which can be configured to correct amplitude and phase imbalance of the balun 100. The mismatch compensation capacitor 107 can be a metal-insulator-metal (MIM) capacitor, which can be implemented, at least partially, within the common metal layer 111 as a vertical or a horizontal arrangement. For example, the capacitor 107 can be a MIM capacitor arranged vertically (as illustrated in FIG. 1), with a first capacitor terminal being part of the metal layer 111, and a second capacitor terminal can be arranged on another metal layer (e.g., 112), under the common metal layer 111. The two metal layers 111 and 112 can be separated by an insulating layer (not referenced in FIG. 1). The second metal layer 112 can be coupled to another reference layer, which may include the ground shield 115, the differential ground 117 or another reference layer. In another example, the capacitor 107 can be a MIM capacitor, with both of its terminals being part of the metal layer 111. The capacitor 107 can be used to couple one of the differential terminals 104 or 106 to the reference layer (e.g., ground).

Figure 2:
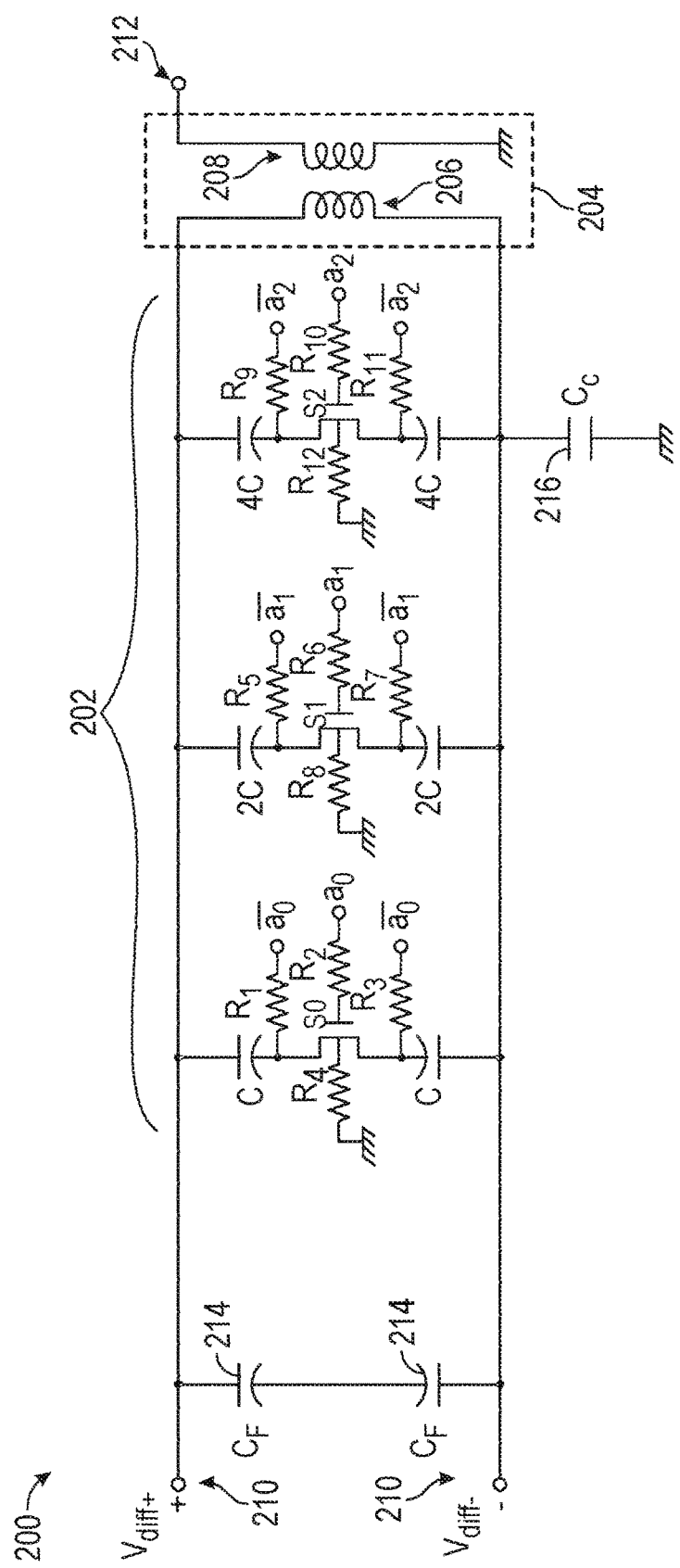
FIG. 2 depicts a switchable transformer-based balun circuit with a digital frequency tuning circuit, in accordance with an example embodiment.

In an example, a transformer-based balun can include a digital tuning circuit for tuning the operating frequency of the balun. The tuning circuit can include a capacitor ladder (or capacitor bank), where one or more individual capacitors can be switched "ON" or "OFF" (e.g., switched into the input of the balun, or isolated from the input of the balun) so as to tune the balun operating frequency to a desired operating frequency. FIG. 2 depicts a switchable transformer-based balun circuit with a digital frequency tuning circuit 202, in accordance with an example embodiment. Referring to FIG. 2, the balun circuit 200 can be configured to have its differential ports 210 coupled to a secondary winding 206 of a transformer 204, and a single-ended (unbalanced) port 212 coupled to a primary winding 208. In an example, the balun circuit 200 can include a mismatch compensation capacitor 216, which can be coupled to one of the differential ports 210 (FIG. 1 illustrates capacitor 216 coupled to the Vdiff-port) and ground. The functionality of the compensation capacitor 216 can be similar to the functionality of the compensation capacitor 107 of FIG. 1, namely, to reduce or suppress amplitude and phase imbalance of the balun circuit 200.

The digital frequency tuning circuit 202 can include a capacitor bank with binary-weighted capacitor pairs, designated in FIG. 2 as C, 2C and 4C. Even though the capacitor bank in FIG. 2 is illustrated as having binary weighted capacitor pairs, the disclosure is not limited in this regard, and other implementations can be used as well. For example, thermometer-weighted capacitors can be used in place of binary-weighted capacitors, or any other capacitors with different or similar capacitance values. Additionally, a single capacitor may be used in place of a capacitor pair. Even though the digital frequency tuning circuit 202 is illustrated as having three capacitor pairs, the disclosure may not be limited in this regard and other number of capacitor pairs can be used as well.

The binary-weighted capacitor pairs in FIG. 2 have capacitance of C, 2C and 4C, respectively, so that each capacitor pair is associated with certain operation frequency of the balun. In an example, each of the capacitor pair can be switched ON or OFF so as to tune the operating frequency of the balun circuit 200 to a desired operating frequency. For example, when all capacitors in the tuning circuit 202 are switched OFF, the balun will be operating at its highest operating frequency. Similarly, when all capacitors in the tuning circuit 202 are switched ON, the balun will be operating at its lowest operating frequency. The highest operating frequency can be established or limited at least in part by the fixed capacitor (214) and the remaining parasitics of the switched-capacitor tuning circuit 202, such as residual parasitic capacitance presented by the tuning circuit 202 even when the capacitors in the ladder are isolated from the balun input.

In an example, each capacitor pair in the tuning circuit 202 can be coupled to a switch, so that selective switching of one or more of the capacitor pairs can be performed. As seen in FIG. 2, capacitor pairs with capacitance C, 2C, and 4C are coupled to (and controlled by) switches S0, S1, and S2, respectively. In an example, the switches S0-S2 can be field effect transistor (FET) switches, such as metal-oxidesemiconductor (MOS) FET. Other types of switches can be used as well in a different example.

In an example, the switches Si (i=0, 1, or 2) can be controlled by first logic signals Ai (applied to the gate terminals of the switches) and second logic signals $\overline{A}i$ applied to the drain and source terminals of the switches. The second logic signals can be complements to the first logic signals. For example, if the first logic signal is a logic high level (e.g., supply voltage signal, or Vdd), then the second logic signal can be a logic low signal (e.g., a complement signal of 0V, or Vss).

In an example, the second logic signal $\overline{A}i$ can be applied to the drain and source terminals by using pull-up resistors (e.g., R1, R3 for S0, R5, R7 for S1, and R9, R11 for S3), coupled to the drain and source terminals. Additionally, separate resistors (e.g., R2, R4, R6, R8 and R10, R12) can be used at the gate and body terminals of each switch to reduce the effect of the source/drain-to-gate and source/drain-to-body capacitances, which lowers the switch high frequency losses when the switches is ON, and improves the switch linearity.

In an example, to power a switch ON (e.g., switch S0), A0 can be a supply voltage signal (Vdd), and $\overline{A}0$ can be a 0V signal. In this regard, the gate voltage of S0 is Vdd and the drain/source bias is pulled to 0V (i.e., Vgs=Vdd), which minimizes the switch Ron (e.g., ON resistance). To power the switch OFF, $\overline{A}0$ can be a supply voltage signal (Vdd), and A0 can be a 0V signal. In this regard, when the switch is powered OFF, the gate voltage is 0V, and the drain/source bias is pulled to Vdd (i.e., Vgs=−Vdd). This significantly increases the Roff (e.g., $V_{DS}$ OFF resistance of the switch) and reverse biases the non-linear MOS capacitance to decrease the switch non-linearities in OFF mode.

In an example, a control circuit (not illustrated in FIG. 2) can be used to receive input (e.g., user input) of a desired operating frequency for the balun 200. The control circuit can then determine, for each capacitor in the tuning circuit 202, whether such capacitor will be ON or OFF, based on the desired operating frequency. The control circuit can then generate an input logic signal, which can be a combination of logic signals A0-A2 and $\overline{A}0$-$\overline{A}2$ for switches S0-S2. The tuning of the capacitor ladder of circuit 202 can be performed during manufacturing or by a user (e.g., dynamically during use, or periodically).

In an example, the balun circuit 200 can include a fixed capacitor (or a capacitor pair) Cf 214, which can be coupled between the differential terminals 210. The fixed capacitor pair 214 can be configured to center (or shift) the operating frequency of the balun 200 to a desired frequency band, in addition to the tuning performed using capacitor pairs C, 2C and 4C.

In an example, the tuning circuit 202 can use varactors in lieu of the switchable capacitors. However, the use of varactors can negatively impact the linearity of the transformer-based balun 200, especially for high power applications due to the voltage dependent nature of the varactor capacitance.

Figure 3:
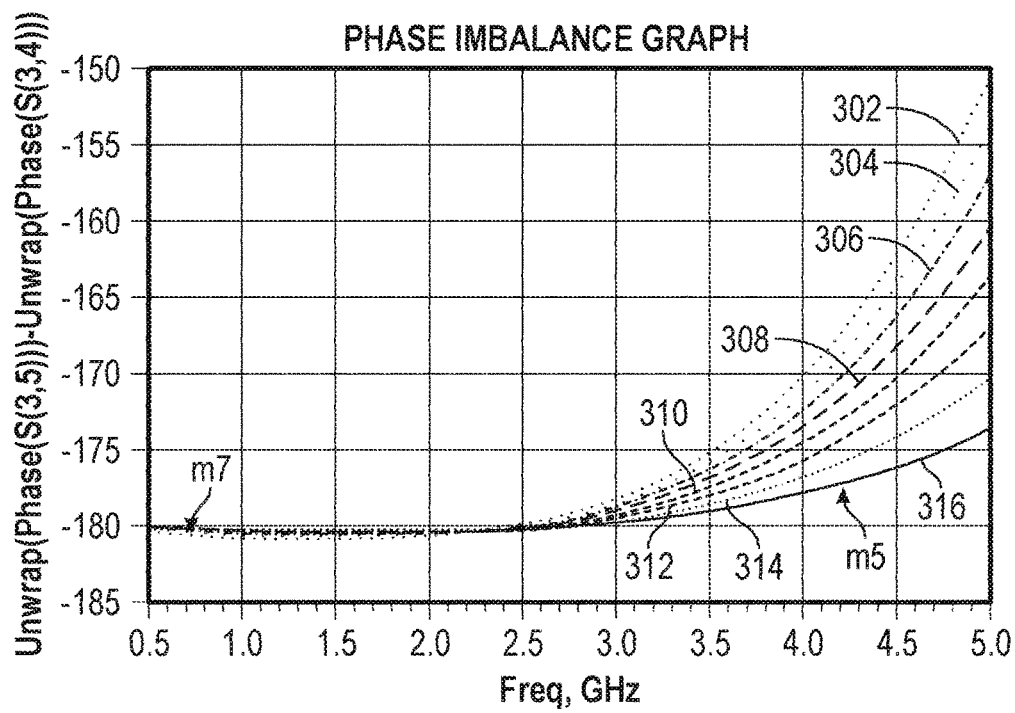
FIG. 3 is a signal diagram illustrating phase imbalance for various settings of the digital frequency tuning circuit for the balun of FIG. 2, in accordance with an example embodiment.

FIG. 3 is a signal diagram illustrating phase imbalance for various settings of the digital frequency tuning circuit for the balun of FIG. 2, in accordance with an example embodiment. Referring to FIG. 3, there are illustrated phase imbalance graphs 302-316, for the following differential switch configurations of the three capacitor pairs of the tuning circuit 202 (in FIG. 2), shown in TABLE 1 below:

TABLE 1

| |
| --- |
| a2 = 2.500, a1 = 2.500, a0 = 2.500 |
| a2 = 2.500, a1 = 2.500, a0 = 0.000 |
| a2 = 2.500, a1 = 0.000, a0 = 2.500 |
| a2 = 2.500, a1 = 0.000, a0 = 0.000 |
| a2 = 0.000, a1 = 2.500, a0 = 2.500 |
| a2 = 0.000, a1 = 2.500, a0 = 0.000 |
| a2 = 0.000, a1 = 0.000, a0 = 2.500 |
| a2 = 0.000, a1 = 0.000, a0 = 0.000 |

The first graph 302 corresponds to voltage high (Vdd) signals applied at A0-A2 (e.g., 2.5V signals), which results in all switches S0-S2 being turned ON (i.e., lowest operating frequency for the balun 200). The last graph 316 corresponds to logic low signals for A0-A2, resulting in all switches S0-S2 being turned OFF (i.e., highest operating frequency for the balun 200). The phase imbalance at markers m7 and m5 is as shown in TABLE 2 below:

TABLE 2

| |
| --- |
| m7-Freq = 792.4 MHz |
| Unwrap(Phase(S(3,5)))-Unwrap(Phase(S(3,4))) = −180.393 |
| a2 = 0.000, a1 = 0.000, a0 = 0.000 |
| m5-Freq = 4.207 GHz |
| Unwrap(Phase(S(3,5)))-Unwrap(Phase(S(3,4))) = −177.162 |
| a2 = 0.000, a1 = 0.000, a0 = 0.000 |

This data illustrates almost no imbalance at marker m7 and about three degrees of imbalance at marker m5.

Figure 4:
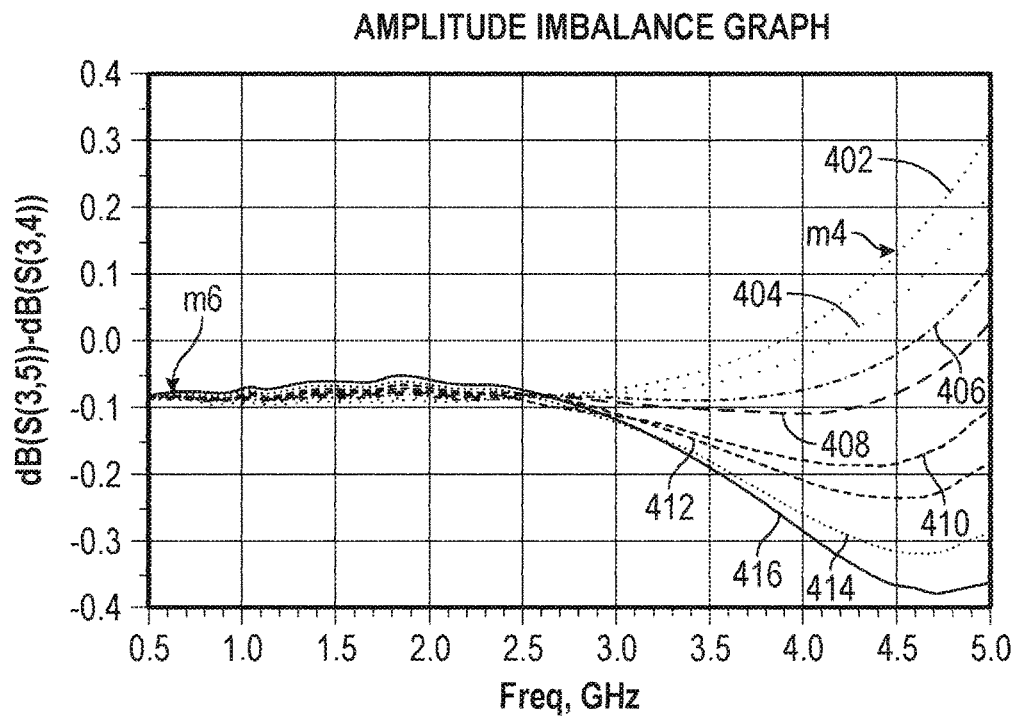
FIG. 4 is a signal diagram illustrating amplitude imbalance for various settings of the digital frequency tuning circuit for the balun of FIG. 2, in accordance with an example embodiment.

FIG. 4 is a signal diagram illustrating amplitude imbalance for various settings of the digital frequency tuning circuit for the balun of FIG. 2, in accordance with an example embodiment. Referring to FIG. 4, there are illustrated amplitude imbalance graphs 402-416, for the following differential switch configurations of the three capacitor pairs of the tuning circuit 202 (in FIG. 2), shown in TABLE 3 below:

TABLE 3

| |
| --- |
| a2 = 0.000, a1 = 0.000, a0 = 0.000 |
| a2 = 0.000, a1 = 0.000, a0 = 2.500 |
| a2 = 0.000, a1 = 2.500, a0 = 0.000 |
| a2 = 0.000, a1 = 2.500, a0 = 2.500 |
| a2 = 2.500, a1 = 0.000, a0 = 0.000 |
| a2 = 2.500, a1 = 0.000, a0 = 2.500 |
| a2 = 2.500, a1 = 2.500, a0 = 0.000 |
| a2 = 2.500, a1 = 2.500, a0 = 2.500 |

The first graph 402 corresponds to logic low signals for A0-A2, resulting in all switches S0-S2 being turned OFF (i.e., highest operating frequency for the balun 200). The last graph 416 corresponds to voltage high (Vdd) signals applied at A0-A2 (e.g., 2.5V signals), which results in all switches S0-S2 being turned ON (i.e., lowest operating frequency for the balun 200). The amplitude imbalance at markers m6 and m4 is as shown in TABLE 4 below:

TABLE 4

| |
| --- |
| m6-Freq=792.4 MHz |
| dB(S(3,5))-dB(S(3,4)) = −0.081 |
| a2 = 0.000, a1 = 2.500, a0 = 2.500 |
| m4-Freq = 4.207 GHz |
| dB(S(3,5))-dB(S(3,4)) = 0.055 |
| a2 = 0.000, a1 = 0.000, a0 = 0.000 |

This data illustrates almost a highest amplitude imbalance of about 0.08 dB at marker m6.

Figure 5:
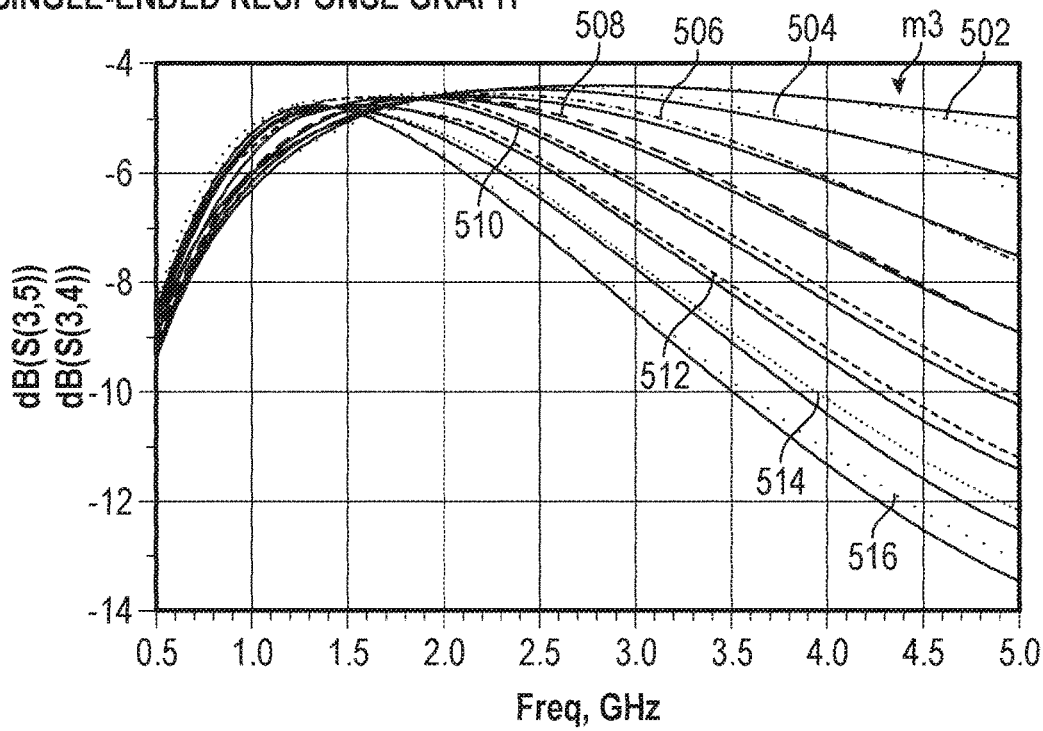
FIG. 5 is a signal diagram illustrating signal losses from the unbalanced terminal to each of the balanced terminals of the balun circuit of FIG. 2 (single-ended response), in accordance with an example embodiment.

FIG. 5 is a signal diagram illustrating signal losses from the unbalanced terminal to each of the balanced terminals of the balun circuit of FIG. 2, in accordance with an example embodiment. Referring to FIG. 5, each of the reference numbers 502-516 is associated with dual graphs illustrating signal losses from the unbalanced terminal (e.g., 212) to the first balanced terminal (e.g., Vdiff+), and from the unbalanced terminal to the second balanced terminal (e.g., Vdiff−), for the following differential switch configurations of the three capacitor pairs of the tuning circuit 202 (in FIG. 2), shown in TABLE 5 below:

TABLE 5

| 502 | dB(S(3, 5)) | interrupted line | a2 = 0.000 |
| | dB(S(3, 4)) | solid line | a1 = 0.000 |
| | | | a0 = 0.000 |
| 504 | dB(S(3, 5)) | interrupted line | a2 = 0.000 |
| | dB(S(3, 4)) | solid line | a1 = 0.000 |
| | | | a0 = 2.500 |
| 506 | dB(S(3, 5)) | interrupted line | a2 = 0.000 |
| | dB(S(3, 4)) | solid line | a1 = 2.500 |
| | | | a0 = 0.000 |
| 508 | dB(S(3, 5)) | interrupted line | a2 = 0.000 |
| | dB(S(3, 4)) | solid line | a1 = 2.500 |
| | | | a0 = 2.500 |
| 510 | dB(S(3, 5)) | interrupted line | a2 = 2.500 |
| | dB(S(3, 4)) | solid line | a1 = 0.000 |
| | | | a0 = 0.000 |
| 512 | dB(S(3, 5)) | interrupted line | a2 = 2.500 |
| | dB(S(3, 4)) | solid line | a1 = 0.000 |
| | | | a0 = 2.500 |
| 514 | dB(S(3, 5)) | interrupted line | a2 = 2.500 |
| | dB(S(3, 4)) | solid line | a1 = 2.500 |
| | | | a0 = 0.000 |
| 516 | dB(S(3, 5)) | interrupted line | a2 = 2.500 |
| | dB(S(3, 4)) | solid line | a1 = 2.500 |
| | | | a0 = 2.500 |

The first graph 502 corresponds to logic low signals for A0-A2, resulting in all switches S0-S2 being turned OFF (i.e., highest operating frequency for the balun 200). The last graph 516 corresponds to voltage high (Vdd) signals applied at A0-A2 (e.g., 2.5V signals), which results in all switches S0-S2 being turned ON (i.e., lowest operating frequency for the balun 200). The signal loss at marker m3 is as shown in TABLE 6 below:

TABLE 6 m3-Freq = 3.540 GHz
dB(S(3,4)) = −4.516
a2 = 0.000, a1 = 0.000, a0 = 0.000

This data illustrates a signal loss of almost 1.5 dB at marker m3.

Figure 6:
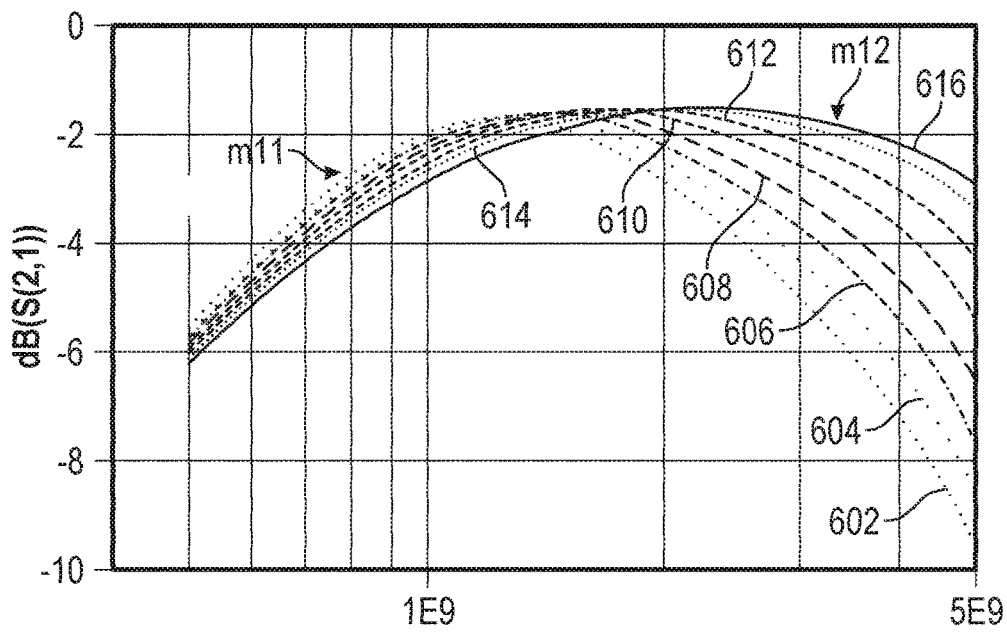
FIG. 6 is a signal diagram illustrating the differential-to-single response of the balun circuit of FIG. 2 (differential response), in accordance with an example embodiment.

FIG. 6 is a signal diagram illustrating the differential-to-single response of the balun circuit of FIG. 2, in accordance with an example embodiment. Referring to FIG. 6, there are illustrated differential-to-single response graphs 616, 614, 612, 610, 608 606, 604, and 602, for the following differential switch configurations of the three capacitor pairs of the tuning circuit 202 (in FIG. 2), shown in TABLE 7 below:

TABLE 7 a2 = 0.000, a1 = 0.000, a0 = 0.000
a2 = 0.000, a1 = 0.000, a0 = 2.500
a2 = 0.000, a1 = 2.500, a0 = 0.000
a2 = 0.000, a1 = 2.500, a0 = 2.500
a2 = 2.500, a1 = 0.000, a0 = 0.000
a2 = 2.500, a1 = 0.000, a0 = 2.500

TABLE 7-continued a2 = 2.500, a1 = 2.500, a0 = 0.000
a2 = 2.500, a1 = 2.500, a0 = 2.500

The first graph 616 corresponds to logic low signals for A0-A2, resulting in all switches S0-S2 being turned OFF (i.e., highest operating frequency for the balun 200). The last graph 602 corresponds to voltage high (Vdd) signals applied at A0-A2 (e.g., 2.5V signals), which results in all switches S0-S2 being turned ON (i.e., lowest operating frequency for the balun 200). The differential response at markers m11 and m12 are as shown in TABLE 8 below:

TABLE 8 m11-Freq = 792.4 MHz
dB(S(2,1)) = −2.793
a2 = 2.500, a1 = 2.500, a0 = 2.500
m12-Freq = 4.207 GHz
dB(S(2,1)) = −2.296
a2 = 0.000, a1 = 0.000, a0 = 0.000

Figure 7:
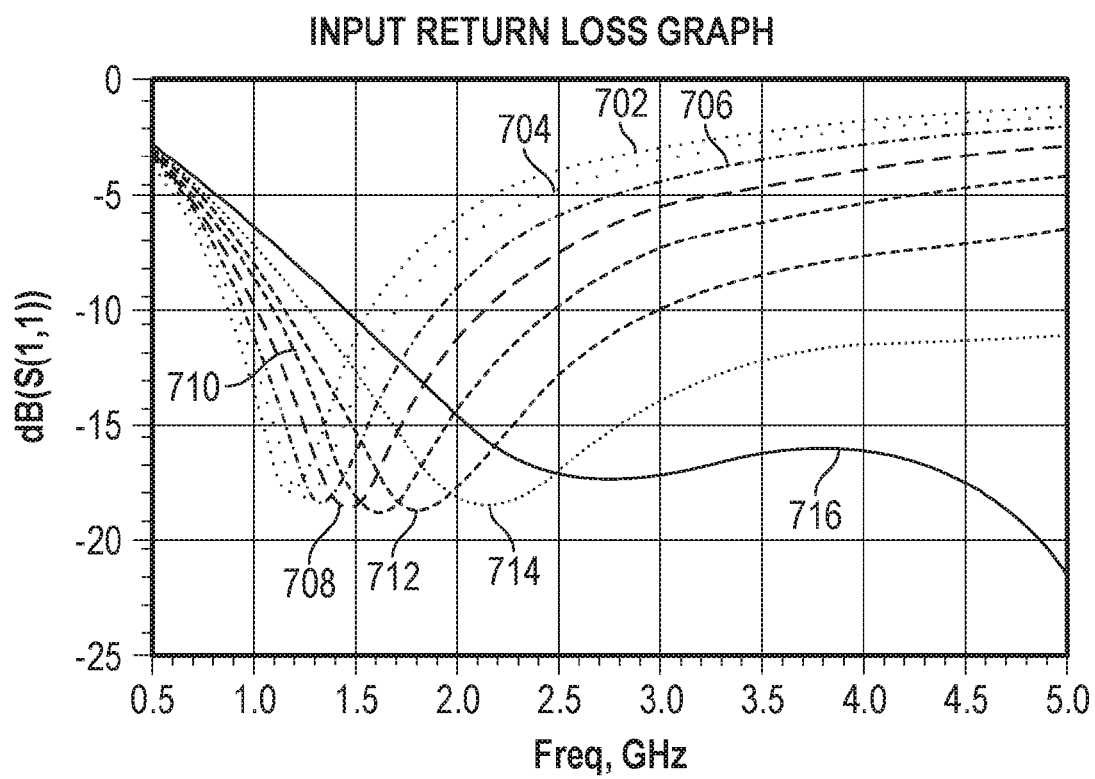
FIG. 7 is a signal diagram illustrating return losses of the single-ended (unbalanced) terminal of the balun circuit of FIG. 2 (input return loss), in accordance with an example embodiment.

FIG. 7 is a signal diagram illustrating return losses of the single-ended (unbalanced) terminal of the balun circuit of FIG. 2, in accordance with an example embodiment. Referring to FIG. 7, there are illustrated return loss graphs 702-716, for the following differential switch configurations of the three capacitor pairs of the tuning circuit 202 (in FIG. 2), shown in TABLE 9 below:

TABLE 9 a2 = 2.500, a1 = 2.500, a0 = 2.500
a2 = 2.500, a1 = 2.500, a0 = 0.000
a2 = 2.500, a1 = 0.000, a0 = 2.500
a2 = 2.500, a1 = 0.000, a0 = 0.000
a2 = 0.000, a1 = 2.500, a0 = 2.500
a2 = 0.000, a1 = 2.500, a0 = 0.000
a2 = 0.000, a1 = 0.000, a0 = 2.500
a2 = 0.000, a1 = 0.000, a0 = 0.000

The first graph 702 corresponds to voltage high (Vdd) signals applied at A0-A2 (e.g., 2.5V signals), which results in all switches S0-S2 being turned ON (i.e., lowest operating frequency for the balun 200). The last graph 716 corresponds to logic low signals for A0-A2, resulting in all switches S0-S2 being turned OFF (i.e., highest operating frequency for the balun 200).

Figure 8:
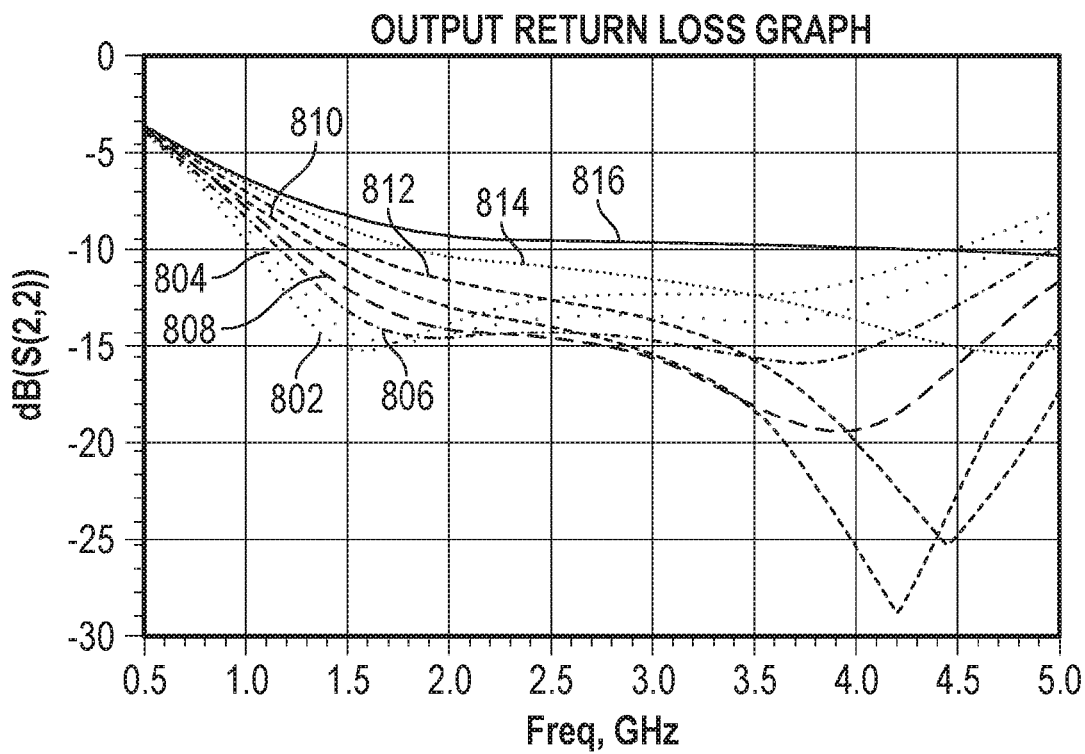
FIG. 8 is a signal diagram illustrating return losses of the balanced terminals of the balun circuit of FIG. 2 (output return loss), in accordance with an example embodiment.

FIG. 8 is a signal diagram illustrating return losses of the balanced terminals of the balun circuit of FIG. 2, in accordance with an example embodiment. Referring to FIG. 8, there are illustrated return loss graphs 802-816, for the following differential switch configurations of the three capacitor pairs of the tuning circuit 202. (in FIG. 2), shown in TABLE 10 below:

TABLE 10 a2 = 2.500, a1 = 2.500, a0 = 2.500
a2 = 2.500, a1 = 2.500, a0 = 0.000
a2 = 0.000, a1 = 2.500, a0 = 2.500
a2 = 2.500, a1 = 0.000, a0 = 2.500
a2 = 0.000, a1 = 2.500, a0 = 2.500
a2 = 0.000, a1 = 0.000, a0 = 0.000
a2 = 0.000, a1 = 0.000, a0 = 2.500
a2 = 0.000, a1 = 0.000, a0 = 0.000

The first graph 802 corresponds to voltage high (Vdd) signals applied at A0-A2 (e.g., 2.5V signals), which results in all switches S0-S2 being turned ON (i.e., lowest operating frequency for the balun 200). The last graph 816 corresponds to logic low signals for A0-A2, resulting in all switches S0-S2 being turned OFF (i.e., highest operating frequency for the balun 200).

Even though Tables 1-10 use a voltage high signal of 2.5 V, the disclosure is not limited in this regard and other voltage high (e.g., Vdd) signals may also be used.

Figure 9:
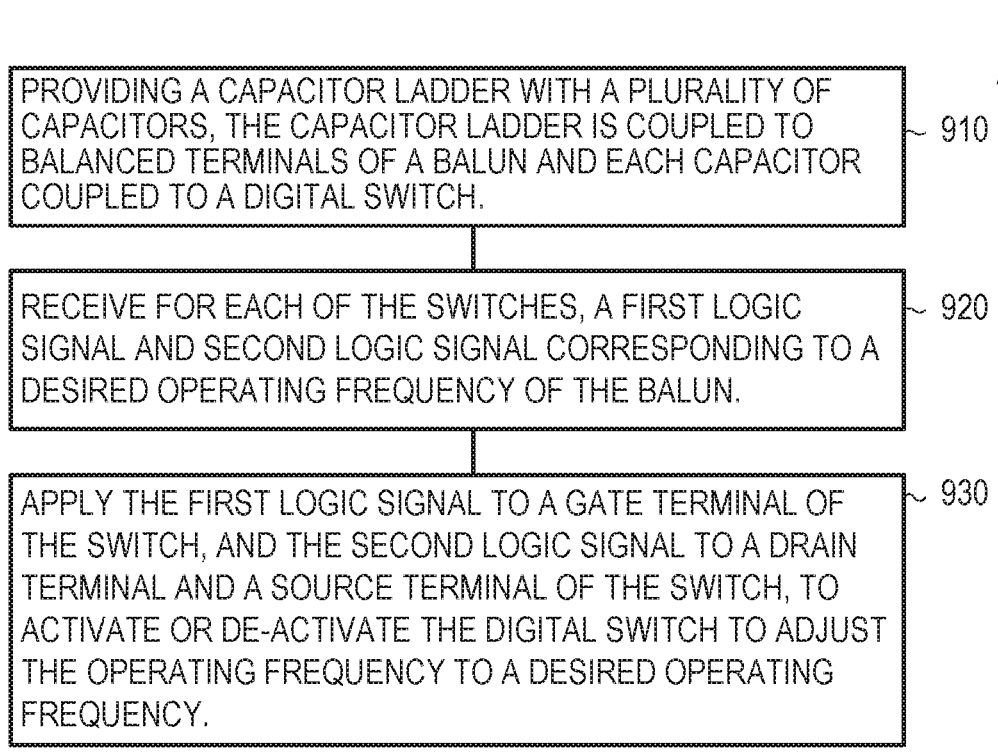
FIG. 9 illustrates a flow diagram of an example method for adjusting the operating frequency of a balun with two balanced terminals and an unbalanced terminal, in accordance with an embodiment.

FIG. 9 illustrates a flow diagram of an example method for adjusting the operating frequency of a balun with two balanced terminals and an unbalanced terminal, in accordance with an embodiment. Referring to FIG. 2 and FIG. 9, the example method 900 can include a method of adjusting the operating frequency of a balun (e.g., 200) with two balanced terminals (210) and an unbalanced terminal (212). At 910, a capacitor ladder with a plurality of capacitors can be provided. For example, the balun 200 can include a digital frequency tuning circuit 202 with a capacitor ladder (or capacitor bank) with capacitors C, 2C and 4C. The capacitor ladder can be coupled to the two balanced terminals 210. Each capacitor of the plurality of capacitors can be coupled to a digital switch of a corresponding plurality of digital switches (e.g., S0-S2). At 920, a first logic signal (e.g., Ai) and a second logic signal (e.g., $\overline{Ai}$) can be received for each of the plurality of switches (Si). The logic signals can correspond to a desired operating frequency of the balun and can be used to turn ON or OFF switches Si so as to activate or deactivate capacitors in the capacitor ladder, and tune the operating frequency of the balun 200 to the desired operating frequency. At 930, the first logic signal (e.g., Ai) can be applied to a gate terminal of the digital switch. The second logic signal (e.g., $\overline{Ai}$) can be applied to a drain terminal and a source terminal of the digital switch, to activate or de-activate the digital switch and adjust the operating frequency to the desired operating frequency.

Various Notes & Examples

Example 1 is an integrated balanced-signal-to-unbalanced-signal (balun) circuit, comprising: a first transformer winding having a first terminal and a second terminal operably coupled for a differential signal; a second transformer winding having a third terminal and a fourth terminal operably coupled for a single-ended signal; and an integrated capacitor having a first electrode conductively coupled to one of the first terminal or the second terminal of the first transformer winding, wherein: the first transformer winding and the second transformer winding are inductively coupled to each other; and the first transformer winding and the second transformer winding are at least partially coplanar, including portions of the windings provided on a commonly-shared metal layer of an integrated circuit.

In Example 2, the subject matter of Example 1 optionally includes wherein the first electrode of the integrated capacitor is provided on the metal layer of the first transformer winding.

In Example 3, the subject matter of any one or more of Examples 1-2 optionally include wherein a second electrode of the integrated capacitor is provided on a second metal layer, the integrated capacitor coupling the one of the first terminal or the second terminal of the first transformer winding to a separate reference layer of the integrated circuit.

In Example 4, the subject matter of any one or more of Examples 1-3 optionally include wherein the capacitor is a vertical metal-insulator-metal (MIM) capacitor provided at least partially on the single metal layer, or a metal-oxide-metal (MOM) capacitor implemented on the single metal layer.

In Example 5, the subject matter of any one or more of Examples 1-4 optionally include wherein: the capacitor includes a first terminal and a second terminal; the first terminal is coupled to one of the first port or the second port of the first transformer winding; and the second terminal is coupled to the ground plane layer.

In Example 6, the subject matter of any one or more of Examples 1-5 optionally include wherein the third port is coupled to the single-ended signal and the fourth port is coupled to the ground plane layer.

In Example 7, the subject matter of any one or more of Examples 1-6 optionally include wherein the integrated capacitor is a tunable capacitor that is tuned to reduce or suppress one or both of amplitude imbalance and phase imbalance of the balun circuit.

In Example 8, the subject matter of any one or more of Examples 1-7 optionally include an array of integrated capacitors switchably coupled between the first and second terminals of the first transformer winding or between the third and fourth terminals of the second transformer winding, the array of integrated capacitors configured to establish an operating frequency range of the balun circuit based on a state of one or more switches coupled to the array of capacitors.

Example 9 is a tunable transformer-based balun circuit, comprising: a secondary winding with two balanced terminals; a primary winding with an unbalanced terminal; and a digital frequency tuning circuit, comprising: at least one capacitor between the two balanced terminals; and a digitally-controlled switch coupled to the at least one capacitor, the digitally-controlled switch configured to activate or deactivate the at least one capacitor based on an input logic signal to control an operating frequency range of the balun circuit.

In Example 10, the subject matter of Example 9 optionally includes wherein the at least one capacitor comprises a plurality of capacitor pairs and the digital frequency tuning circuit further comprises: a plurality of digitally-controlled switches, wherein a respective one of the plurality of digitally-controlled switches is coupled to a corresponding capacitor pair of the plurality of capacitor pairs, the respective ones of the plurality of digitally-controlled switches configured to selectively activate or deactivate one or more of the plurality of capacitor pairs based on the input logic signal.

In Example 11, the subject matter of Example 10 optionally includes wherein the plurality of capacitor pairs comprises one of thermometer-weighted capacitor pairs or binary-weighted capacitor pairs.

In Example 12, the subject matter of any one or more of Examples 10-11 optionally include wherein each of the plurality of digital switches comprises a field effect transistor (FET) switch or multiple FET switches in series.

In Example 13, the subject matter of any one or more of Examples 10-12 optionally include wherein for the corresponding capacitor pair of the plurality of capacitor pairs: a drain terminal of the respective one of the plurality of digitally-controlled switches is coupled to a first capacitor of the capacitor pair; and a source terminal of the respective one of the plurality of digitally-controlled switches is coupled to a second capacitor of the capacitor pair.

In Example 14, the subject matter of Example 13 optionally includes wherein the digital frequency tuning circuit further comprises: a first resistor coupled to the drain terminal; a second resistor coupled to a gate terminal of the respective one of the plurality of digitally-controlled switches; a third resistor coupled to the source terminal; and a fourth resistor coupled to a body terminal of the respective one of the plurality of digitally-controlled switches.

In Example 15, the subject matter of Example 14 optionally includes wherein the input logic signal comprises: a first logic signal applied to the second resistor; and a second logic signal applied to the first resistor and the third resistor, the second logic signal representing a complement of the first logic signal.

In Example 16, the subject matter of Example 15 optionally includes wherein: the first logic signal is a voltage signal corresponding to a logic high level and the second logic signal is a voltage signal corresponding to a logic low level, or vice versa.

In Example 17, the subject matter of any one or more of Examples 9-16 optionally include wherein the digital frequency tuning circuit further comprises: a fixed capacitor pair configured to center the operating frequency of the balun within a desired range.

In Example 18, the subject matter of any one or more of Examples 9-17 optionally include wherein the digital frequency tuning circuit further comprises: a compensation capacitor coupled to one of the differential terminals and ground, and configured to compensate for amplitude and phase imbalance of the balun circuit.

Example 19 is a method of adjusting the operating frequency of a balun with two balanced terminals and an unbalanced terminal, the method comprising: providing a capacitor ladder with a plurality of capacitors, wherein the capacitor ladder is coupled to the two balanced terminals and each capacitor of the plurality of capacitors is coupled to a digital switch of a corresponding plurality of digital switches; receiving for each of the plurality of switches, a first logic signal and second logic signal corresponding to a desired operating frequency of the balun; and applying the first logic signal to a gate terminal of the digital switch, and the second logic signal to a drain terminal and a source terminal of the digital switch, to activate or de-activate the digital switch to adjust the operating frequency to the desired operating frequency.

Example 20, the subject matter of Example 19 optionally includes determining the first logic signal and the second logic for each of the plurality of switches based on the desired operating frequency.

In Example 21, the subject matter of any one or more of Examples 19-20 optionally include wherein the first logic signal corresponds to a logic high level and the second logic signal corresponds to a logic low level, and the method further comprises: applying the first logic signal to the gate terminal of the digital switch to turn the digital switch ON to activate a corresponding capacitor in the capacitor ladder.

In Example 22, the subject matter of Example 21 optionally includes wherein the second logic signal corresponds to a logic high level and the first logic signal corresponds to a logic low level, and the method further comprises: applying the second logic signal to the drain terminal and the source terminal of the digital switch to turn the digital switch OFF to de-activate the corresponding capacitor in the capacitor ladder.

Each of the non-limiting examples described herein can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An integrated balanced-signal-to-unbalanced-signal (balun) circuit, comprising:
   a first transformer winding having a first terminal and a second terminal operably coupled for a differential signal;
   a second transformer winding having a third terminal and a fourth terminal operably coupled for a single-ended signal; and
   an integrated capacitor having a first electrode conductively coupled to one of the first terminal or the second terminal of the first transformer winding, wherein the capacitor is integrated within a metal layer that is commonly-shared with the first transformer winding and the second transformer winding and within at least another conductive layer insulated from the commonly-shared metal layer, and wherein the first terminal, the second terminal and the first transformer winding are disposed within the commonly-shared metal layer.

2. The balun circuit of claim 1, wherein:
   the first transformer winding and the second transformer winding are inductively coupled to each other; and
   the first transformer winding and the second transformer winding are at least partially coplanar, including portions of the windings provided on the commonly-shared metal layer.

3. The balun circuit of claim 2, wherein the first electrode of the integrated capacitor is provided on the metal layer of the first transformer winding.

4. The balun circuit of claim 2, wherein a second electrode of the integrated capacitor is provided on a second metal layer, the integrated capacitor coupling the one of the first terminal or the second terminal of the first transformer winding to a separate reference layer of the integrated circuit.

5. The balun circuit of claim 1, wherein the capacitor is a vertical metal-insulator-metal (MIM) capacitor provided at least partially on the single metal layer, or a metal-oxide-metal (MOM) capacitor implemented on the single metal layer.

6. The balun circuit of claim 1, wherein:
   the capacitor includes a first terminal and a second terminal;
   the first terminal is coupled to one of the first port or the second port of the first transformer winding; and
   the second terminal is coupled to the ground plane layer.

7. The balun circuit of claim 1, wherein the third port is coupled to the single-ended signal and the fourth port is coupled to the ground plane layer.

8. The balun circuit of claim 1, wherein the integrated capacitor is a tunable capacitor that is tuned to reduce or suppress one or both of amplitude imbalance and phase imbalance of the balun circuit.

9. The balun circuit of claim 1, comprising an array of integrated capacitors switchably coupled between the first and second terminals of the first transformer winding or between the third and fourth terminals of the second transformer winding, the array of integrated capacitors configured to establish an operating frequency range of the balun circuit based on a state of one or more switches coupled to the array of capacitors.

10. A tunable transformer-based balun circuit, comprising:
    a secondary winding with two balanced terminals;
    a primary winding with an unbalanced terminal; and
    a digital frequency tuning circuit, comprising a plurality of digitally-controlled switches coupled to a corresponding plurality of capacitor pairs, the digitally-controlled switches configured to receive a control signal based on the operating frequency range of the balun circuit,
    wherein for a corresponding capacitor pair of the plurality of capacitor pairs:
    a first terminal of the respective one of the plurality of digitally-controlled switches is coupled to a first capacitor of the capacitor pair; and
    a second terminal of the respective one of the plurality of digitally-controlled switches is coupled to a second capacitor of the capacitor pair.

11. The tunable transformer-based balun circuit of claim 10, wherein the control signal comprises an input logic signal.

12. The tunable transformer-based balun circuit of claim 11, wherein the digitally-controlled switches are configured to activate or deactivate the capacitor pairs using the input logic signal.

13. The tunable transformer-based balun circuit of claim 11, wherein
    a respective one of the plurality of digitally-controlled switches is coupled to a corresponding capacitor pair of the plurality of capacitor pairs, the respective ones of the plurality of digitally-controlled switches configured to selectively activate or deactivate one or more of the plurality of capacitor pairs based on the input logic signal.

14. The tunable transformer-based balun circuit of claim 13, wherein the plurality of capacitor pairs comprises one of thermometer-weighted capacitor pairs or binary-weighted capacitor pairs.

15. The tunable transformer-based balun circuit of claim 13, wherein each of the plurality of digitally-controlled switches comprises a field effect transistor (FET) switch or multiple FET switches in series.

16. The tunable transformer-based Mutt circuit of claim 10, wherein the digital frequency tuning circuit further comprises:
    a first resistor coupled to the first terminal;
    a second resistor coupled to a third terminal of the respective one of the plurality of digitally-controlled switches;
    a third resistor coupled to the second terminal; and
    a fourth resistor coupled to a fourth terminal of the respective one of the plurality of digitally-controlled switches.

17. The tunable transformer-based balun circuit of claim 16, wherein the input logic signal comprises:
    a first logic signal applied to the second resistor; and
    a second logic signal applied to the first resistor and the third resistor, the second logic signal representing a complement of the first logic signal.

18. The tunable transformer-based balun circuit of claim 17, wherein:
    the first logic signal is a voltage signal corresponding to a logic high level and the second logic signal is a voltage signal corresponding to a logic low level, or vice versa.

19. The tunable transformer-based balun circuit of claim 10, wherein the digital frequency tuning circuit further comprises:
  a fixed capacitor pair configured to center the operating frequency of the balun within a desired range.

20. The tunable transformer-based balun circuit of claim 10, wherein the digital frequency tuning circuit further comprises:
  a compensation capacitor coupled to one of the differential terminals and ground, and configured to compensate for amplitude and phase imbalance of the balun circuit.

21. A method of adjusting the operating frequency of a balun with two balanced terminals and an unbalanced terminal, the method comprising:
  receiving for a plurality of digitally-controlled switches, wherein a corresponding switch is coupled between two capacitors of a corresponding capacitor pair of a plurality of capacitor pairs forming a capacitor ladder within the balun, at least one logic signal corresponding to a desired operating frequency of the balun; and
  applying or removing a selected capacitance across the two balanced terminals using one or more of the plurality of capacitor pairs to change the operating frequency of the balun, wherein the selected capacitance is based on the received at least one logic signal corresponding to the desired operating frequency.

22. The method of claim 21, wherein the one or more logic signals comprise a first logic signal and a second logic signal, and applying the selected capacitance further comprises:
  for each of the plurality of digitally-controlled switches, applying the first logic signal to a gate terminal of the digitally-controlled switch, and the second logic signal to a drain terminal and a source terminal of the digitally-controlled switch, to activate or de-activate the digitally-controlled switch to adjust the operating frequency to the desired operating frequency.

23. The method according to claim 22, further comprising:
  determining the first logic signal and the second logic for each of the plurality of digitally-controlled switches based on the desired operating frequency.

24. The method according to claim 22, wherein the first logic signal corresponds to a logic high level and the second logic signal corresponds to a logic low level, and the method further comprises:
  applying the first logic signal to the gate terminal of the digitally-controlled switch to turn the digitally-controlled switch ON to activate a corresponding capacitor in the capacitor ladder.

25. The method according to claim 24, wherein the second logic signal corresponds to a logic high level and the first logic signal corresponds to a logic low level, and the method further comprises:
  applying the second logic signal to the drain terminal and the source terminal of the digitally-controlled switch to turn the digitally-controlled switch OFF to de-activate the corresponding capacitor in the capacitor ladder.

* * * * *

UNITED STATES PATENT AND TRADEMARK OFFICE
CERTIFICATE OF CORRECTION

PATENT NO. : 10,200,009 B2
APPLICATION NO. : 15/253647
DATED : February 5, 2019
INVENTOR(S) : Abdalla et al.

It is certified that error appears in the above-identified patent and that said Letters Patent is hereby corrected as shown below:

In the Claims

Column 14, Line 28, Claim 13, after "wherein", insert --:--

Column 14, Line 45, Claim 16, delete "Mutt" and insert --balun-- therefor

Signed and Sealed this
Seventeenth Day of September, 2019

Andrei Iancu
*Director of the United States Patent and Trademark Office*